(12) United States Patent
Chien et al.

(10) Patent No.: US 11,169,561 B2
(45) Date of Patent: Nov. 9, 2021

(54) CLOCK DATA RECOVERY DEVICE AND METHOD TO ALTERNATIVELY ADJUST PHASES OF OUTPUTTED CLOCK SIGNALS

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ting-Hsu Chien, Hsinchu (TW); Yen-Chung T. Chen, Hsinchu (TW); Tsai-Ming Yang, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 51 days.

(21) Appl. No.: 16/748,805

(22) Filed: Jan. 22, 2020

(65) Prior Publication Data
US 2021/0026396 A1    Jan. 28, 2021

(30) Foreign Application Priority Data
Jul. 22, 2019   (TW) ................................. 108125878

(51) Int. Cl.
| | |
|---|---|
| G06F 1/08 | (2006.01) |
| G06F 9/30 | (2018.01) |
| H04L 7/00 | (2006.01) |
| G06F 1/12 | (2006.01) |

(52) U.S. Cl.
CPC .................. G06F 1/08 (2013.01); G06F 1/12 (2013.01); G06F 9/30087 (2013.01); H04L 7/0025 (2013.01)

(58) Field of Classification Search
CPC combination set(s) only.
See application file for complete search history.

(56) References Cited

U.S. PATENT DOCUMENTS

| | | | | |
|---|---|---|---|---|
| 4,800,342 | A * | 1/1989 | Jackson ................ | H03L 7/1976 331/10 |
| 9,461,811 | B1 * | 10/2016 | Chien ................... | H03L 7/0998 |
| 9,590,640 | B1 * | 3/2017 | Hsieh ................... | H03L 7/1075 |
| 9,787,468 | B2 * | 10/2017 | Mai .......................... | H04L 7/04 |
| 2010/0308880 | A1 * | 12/2010 | Wang ................... | H03L 7/0807 327/163 |

(Continued)

FOREIGN PATENT DOCUMENTS

| | | |
|---|---|---|
| TW | 201541922 A | 11/2015 |
| TW | I542157 B | 7/2016 |

*Primary Examiner* — Raymond N Phan
(74) *Attorney, Agent, or Firm* — CKC & Partners Co., LLC

(57) ABSTRACT

A clock data recovery device includes a phase detector circuitry, a signal control circuitry, and interpolators. The phase detector is configured to detect a phase of an input signal, according to first clock signals, to generate first control signals, and phases of the first clock signals are different to each other. The signal control circuitry is configured to rearrange the first control signals to output as second control signals. The phase interpolators are configured to output second clock signals and alternatively adjust the phases of the second clock signals according to the second control signals to generate an output clock signal.

18 Claims, 7 Drawing Sheets

(56) References Cited

U.S. PATENT DOCUMENTS

| | | | |
|---|---|---|---|
| 2011/0050312 A1* | 3/2011 | Fujino | H03K 5/1565 |
| | | | 327/237 |
| 2013/0329843 A1* | 12/2013 | Takeuchi | H04B 1/69 |
| | | | 375/375 |
| 2015/0304097 A1* | 10/2015 | Yu | H03L 7/07 |
| | | | 375/373 |
| 2016/0294538 A1* | 10/2016 | Chien | H03L 7/0998 |
| 2020/0252072 A1* | 8/2020 | Wu | G11C 29/023 |

* cited by examiner

CLOCK DATA RECOVERY DEVICE AND METHOD TO ALTERNATIVELY ADJUST PHASES OF OUTPUTTED CLOCK SIGNALS

PRIORITY CLAIM AND CROSS-REFERENCE

The present application claims priority to Taiwan Application Ser. No. 108125878, filed Jul. 22, 2019, which is herein incorporated by reference.

BACKGROUND

Technical Field

The present disclosure relates to a signal transmitting device. More particularly, the present disclosure relates to a signal transmitting device for clock data recovery.

Description of Related Art

As the data transmission becomes faster and faster, the efficiency of clock data recovery becomes more important. The efficiency of clock data recovery is associated with the clock data recovery updating rate and the phase step. However, signals with different phase might have destructive interference in certain condition. Thus, the clock data recovery is disabled on phase locked and no clock signal is outputted.

SUMMARY

An embodiment of the present disclosure is associated with a clock data recovery device which includes a phase detector circuitry, a signal control circuitry, and phase interpolators. The phase detector circuitry is configured to detect a phase of an input signal according to first clock signals, to generate first control signals. The phases of the first clock signals are different to each other. The signal control circuitry is configured to rearrange the first control signals to output as second control signals. The phase interpolators are configured to output second clock signals, respectively, and to alternatively adjust phases of the second clock signals to generate an output clock signal, according to the second control signals.

An embodiment of the present disclosure is associated with a clock data recovery method which includes the following operations: according to first clock signals, detecting a phase of an input signal to generate first control signals; rearranging the first control signals to output as second control signals; and outputting, by phase interpolators, second clock signals, and alternatively adjusting phases of the second clock signals to generate an output clock signal, according to the second control signals. The phases of the first control signals are different to each other.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
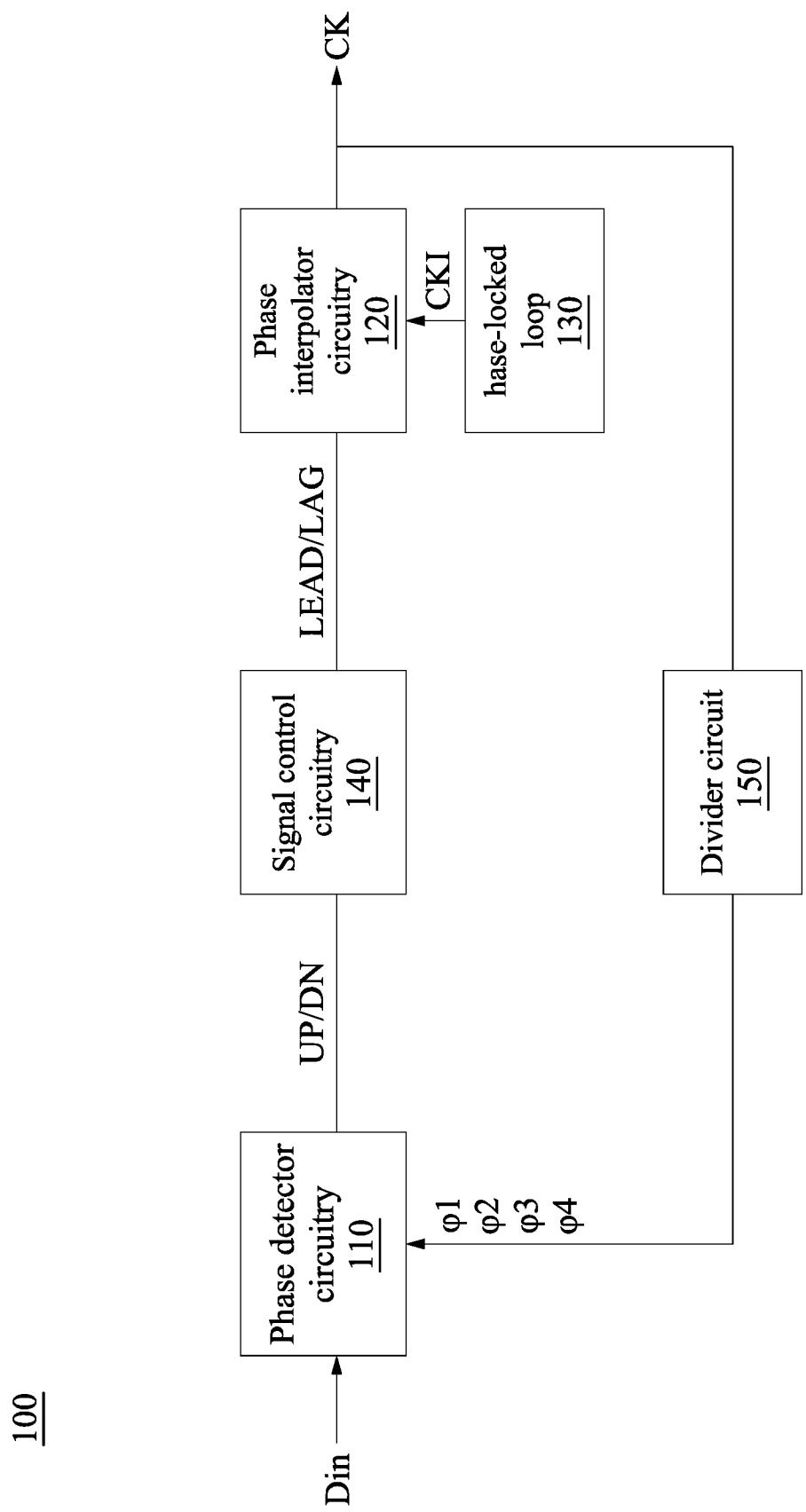
FIG. 1 is a schematic diagram of a clock data recovery device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

In this document, the term "circuitry" may be used herein to describe a system including one of more circuit. The term "circuit" may be used herein to describe a device having one or more transistors and/or one or more active elements connecting in a particular configuration to process signal.

Reference is now made to FIG. 1. FIG. 1 is a schematic diagram of a clock data recovery device 100 according to some embodiments of the present disclosure. For illustration in FIG. 1, the clock data recovery device 100 includes a phase detector circuitry 110, a phase interpolator circuitry 120, a phase-locked loop 130, a signal control circuitry 140, and a divider circuit 150. In some embodiments, the clock data recovery device 100 is configured to perform clock data recovery according to an input signal Din to generate an output clock signal CK.

For illustration in FIG. 1, the phase detector circuitry 110 is coupled to the signal control circuitry 140. The signal control circuitry 140 is coupled to the phase interpolator circuitry 120. The phase-locked loop 130 is coupled to the phase interpolator circuitry 120. The phase interpolator circuitry 120 is coupled to the phase detector circuitry 110 via the divider circuit 150 to form a loop.

In some embodiments, the phase detector circuitry 110 is configured to receive the input signal Din and clock signals φ1~φ4, and to generate control signals UP/DN. The phase detector circuitry 110 is configured to detect the phase of the input signal Din, according to the clock signals φ1~φ4, to generate the control signals UP/DN.

In some embodiments, the signal control circuitry 140 is configured to receive the control signals UP/DN, and to generate control signals LEAD/LAG. The signal control circuitry 140 is configured to rearrange the control signals UP/DN to output as the control signals LEAD/LAG. In some embodiments, the control signals UP/DN and the control signals LEAD/LAG include signals, for example, the control signals UP1/DN1, the control signals UP2/DN2, the control signals LEAD1/LAG1, and the control signals LEAD2/LAG2 shown in FIG. 2. In the present disclosure, if a reference number of a control signal does not include numbers, such as UP/DN and LEAD/LAG, the said control signal with the said reference number represents whole or a part of the control signals. For example, the control signals UP/DN may be used to describe any combination of the control signals UP1/DN1, UP2/DN2, UP3/DN3, and UP4/DN4.

In some embodiments, the phase interpolator circuitry 120 is configured to receive the control signals LEAD/LAG and a reference clock signal CKI, and to generate the output clock signal CK. The phase interpolator circuit 120 is configured to adjust the output clock signal CK according to the control signals LEAD/LAG and the reference clock signal CKI.

In some embodiments, the phase-locked loop 130 is configured to generate the reference clock signal CKI, and transmit the reference clock signal CKI to the phase interpolator circuitry 120. In some embodiments, the phase of the reference clock signal CKI does not change by performing the clock data recovery.

In some embodiments, the divider circuit 150 is configured to receive the output clock signal CK, and to output the clock signals φ1~φ4 to the phase detector circuitry 110. The divider circuit 150 is configured to generate the clock signals φ1~φ4 according to the output clock signal CK. In some embodiments, the frequency of the clock signals φ1~φ4 is different from the frequency of the output clock signal CK. For example, the frequency of the output clock signal CK is 4 times of the frequency of the clock signals φ1~φ4. In some embodiments, the phases of the clock signals φ1~φ4 are different. For example, the phases of the clock signals φ1~φ4 have 90 degree offset to each other.

The clock data recovery device 100 described above, which includes the numbers of the clock signals φ1~φ4, the control signals UP/DN, and the control signals LEAD/LAG, is provided for illustrative purposes. Various clock data recovery devices 100 are within the contemplated scope of the present disclosure.

Figure 2:
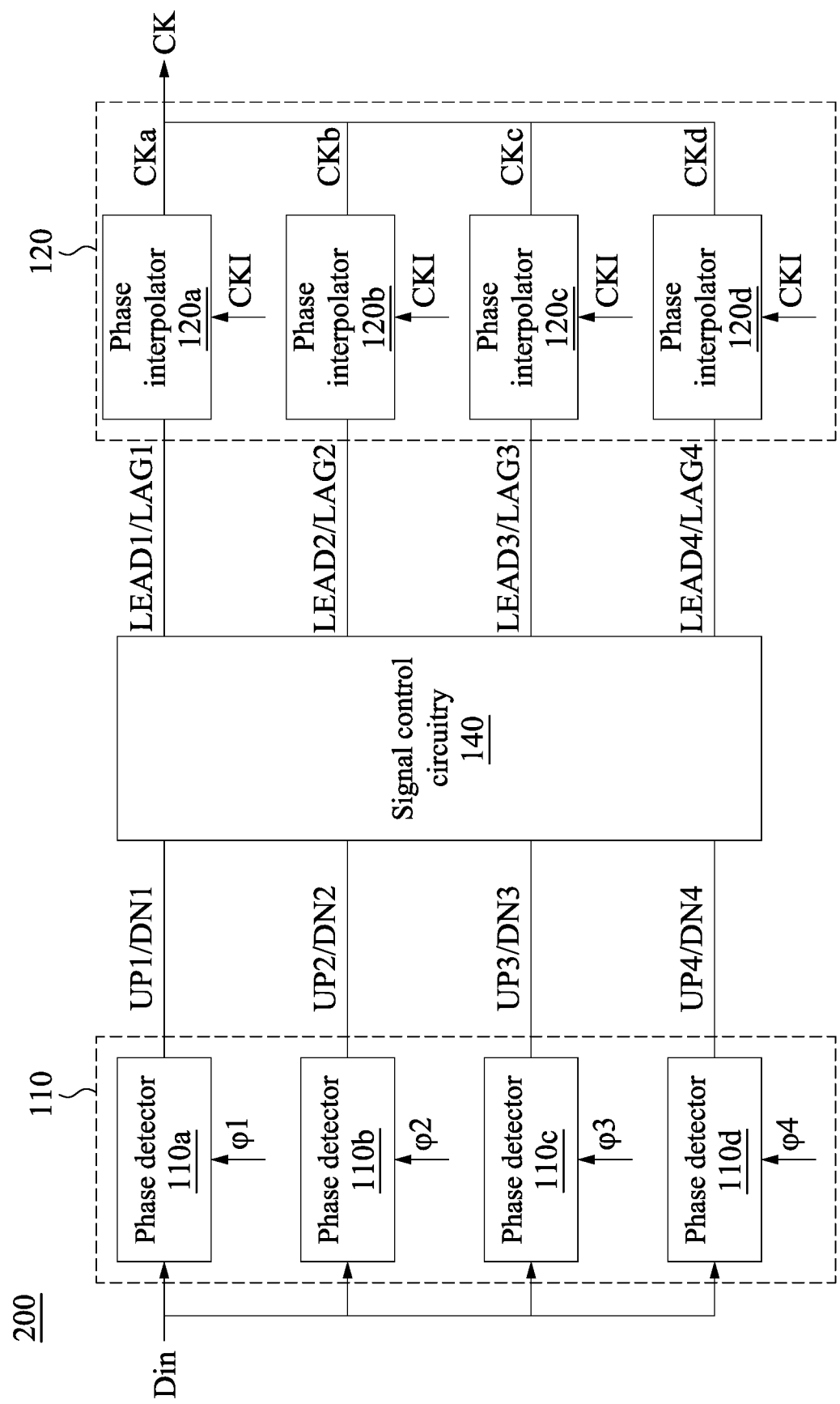
FIG. 2 is a schematic diagram of a clock data recovery device, in accordance with some embodiments.

Reference is made to FIG. 2. FIG. 2 is a schematic diagram of a clock data recovery device 200 according to some embodiments of the present disclosure. In some embodiments, the clock data recovery device 200 is part of the clock data recovery device 100 shown in FIG. 1. For the better understanding, the reference numbers for the similar elements in FIG. 2 are designated with the same reference numbers shown in FIG. 1.

For illustration in FIG. 2, the clock data recovery device 200 includes the phase detector circuitry 110, the signal control circuitry 140, and the phase interpolator circuitry 120. The phase detector circuitry 110 includes a phase detector 110a, a phase detector 110b, a phase detector 110c, and a phase detector 110d. The phase interpolator circuitry 120 includes a phase interpolator 120a, a phase interpolator 120b, a phase interpolator 120c, and a phase interpolator 120d.

For illustration in FIG. 2, the phase detector 110a, the phase detector 110b, the phase detector 110c, and the phase detector 110d are coupled to the signal control circuitry 140. The phase interpolator 120a, the phase interpolator 120b, the phase interpolator 120c, and the phase interpolator 120d are coupled to the signal control circuitry 140. The phase detectors 110a-110d are coupled to the phase interpolators 120a-120d through the signal control circuitry 140.

In some embodiments, the phase detector 110a, the phase detector 110b, the phase detector 110c, and the phase detector 110d are configured to receive the input signal Din, and to receive the clock signal φ1, the clock signal φ2, the clock signal φ3, and the clock signal φ4, respectively. The phase detector 110a, the phase detector 110b, the phase detector 110c, and the phase detector 110d are further configured to generate the control signal UP1/DN1, the control signal UP2/DN2, the control signal UP3/DN3, and the control signal UP4/DN4, respectively. The phase detector 110a is configured to detect the phase of the input signal Din according to the clock signal φ1, to generate the control signal UP1/DN1. The phase detector 110b, the phase detector 110c, and the phase detector 110d are configured to perform the similar operations, therefore, the description will not repeat herein again.

In some embodiments, the phases of the clock signal φ1, the clock signal φ2, the clock signal φ3, and the clock signal φ4 are different to each other. Therefore, the signal values of the control signals UP1/DN1, the control signal UP2/DN2, the control signal UP3/DN3, and the control signal UP4/DN4 generated, according to different phases, could be different.

In some embodiments, the signal control circuitry 140 is configured to receive the control signal UP1/DN1, the control signal UP2/DN2, the control signal UP3/DN3, and the control signal UP4/DN4, and to generate the control signal LEAD1/LAG1, the control signal LEAD2/LAG2, the control signal LEAD3/LAG3, and the control signal LEAD4/LAG4. The signal control circuitry 140 is configured to rearrange the control signals UP1/DN1-UP4/DN4 as the control signals LEAD1/LAG1-LEAD4/LAG4.

In some embodiments, the phase interpolator 120a, the phase interpolator 120b, the phase interpolator 120c, the phase interpolator 120d are configured to receive the control signal LEAD1/LAG1, the control signal LEAD2/LAG2, the control signal LEAD3/LAG3, and the control signal LEAD4/LAG4, respectively, and to generate the output clock signal CK. In some embodiments, each of the phase interpolators 120a-120d also receives the reference clock signal CKI. Each of the phase interpolators 120a-120d is configured to generate the output clock signal CK according to a corresponding signal in the control signals LEAD1/LAG1-LEAD4/LAG4 and the reference clock signal CKI.

In some embodiments, the phase interpolator 120a is configured to output the clock signal CKa, and configured to adjust the phase of the clock signal CKa according to the received control signal LEAD1/LAG1 and the reference clock signal CKI. The phase interpolator 120b, the phase interpolator 120c, and the phase interpolator 120d are configured to perform the similar operations as the interpolator 120a, and configured to output the clock signal CKb, the clock signal CKc, and the clock signal CKd.

In some embodiments, the phase interpolator circuitry 120 is configured to alternatively adjust the clock signals CKa-CKd according to the control signals LEAD1/LAG1-LEAD4/LAG4 and the reference clock signal CKI. In some embodiments, the phase interpolator circuitry 120 is further configured to sum up the clock signals CKa-CKd to output as the output clock signal CK.

For example, each of the phase interpolators 120a-120d is implemented by an analog phase interpolator. Taking the phase interpolator 120a as an example, the phase interpolator 120a sets the current distribution ratio according to the control signal LEAD1/LAG1, to adjust the phase of the clock signal CKa according to the reference clock signal CKI and the ratio. The clock signal CKa can be a signal represented by a current. Thus, the outputs of the phase interpolators 120a-120d can be outputted directly, to sum up the currents (which are the clock signals CKa-CKd) as the output clock signal CK. The embodiments of the phase interpolators 120a-120d described above are given for illustrative purposes, and the present disclosure is not limited thereto.

Figure 3:
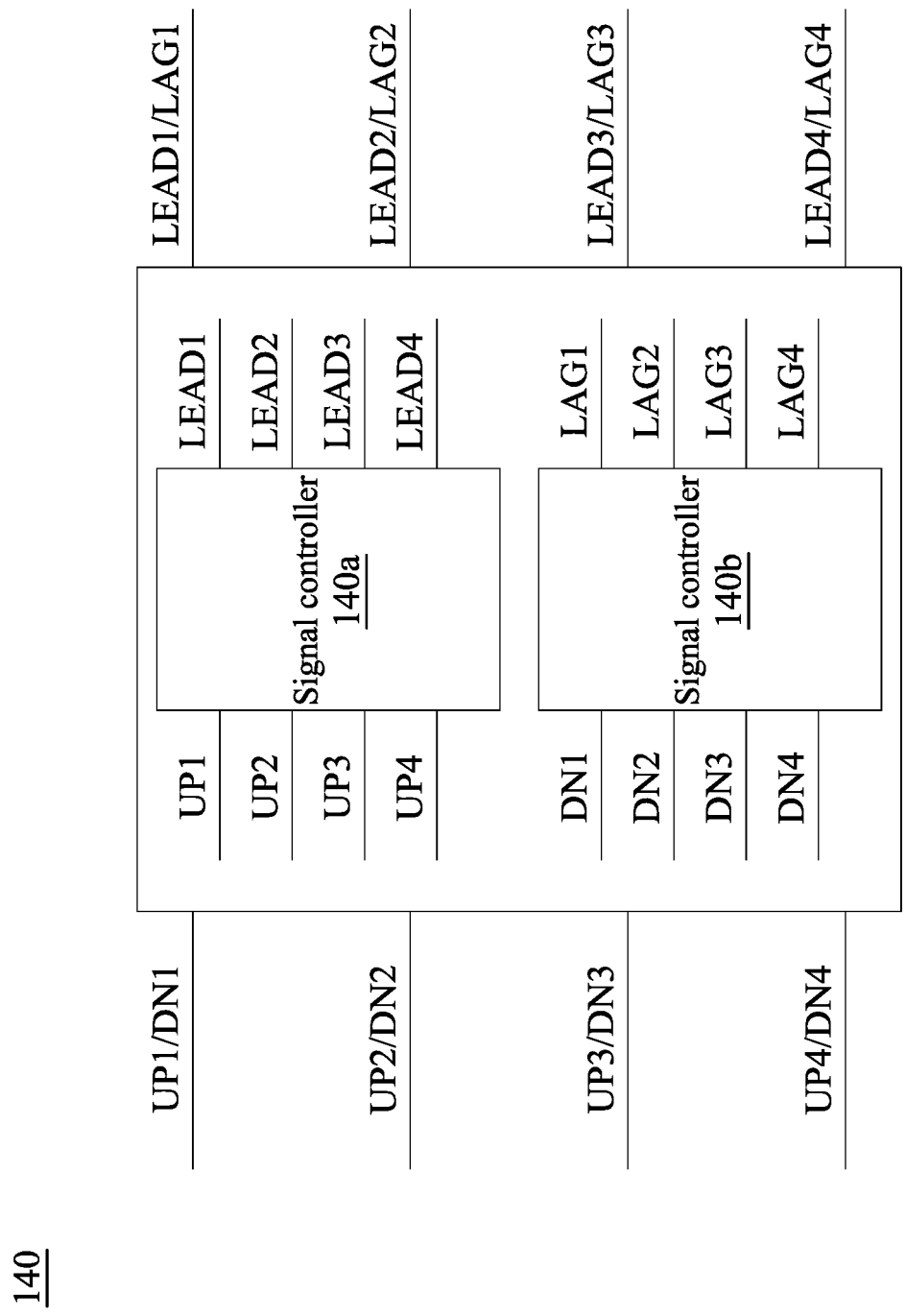
FIG. 3 is a schematic diagram of a signal control circuitry in the clock data recovery device shown in FIG. 2, in accordance with some embodiments.

Reference is made to FIG. 3. FIG. 3 is a schematic diagram of a signal control circuitry 140 in the clock data recovery device 200 shown in FIG. 2 according to some embodiments of the present disclosure. For the better understanding, FIG. 3 is described with respect to FIG. 2, and the similar elements in FIG. 3 are designated with the same reference numbers shown in FIG. 2. For illustration in FIG. 3, the signal control circuitry 140 includes a signal controller 140a and a signal controller 140b.

In some embodiments, the control signals UP/DN include leading signals UP and lagging signals DN. Similarly, the control signals UP1/DN1-UP4/DN4 include leading signals UP1-UP4 and lagging signals DN1-DN4. For illustration in FIG. 3, the signal control circuitry 140 receives the control signals UP1/DN1-UP4/DN4, in which the signal controller 140a is configured to receive the leading signals UP1-UP4, and the signal controller 140b is configured to receive the lagging signals DN1-DN4.

In some embodiments, when the phase detector 110a detects the phase of the input signal Din according to the clock signal φ1, and determines that the phase of the output clock signal CK need to be forwarded, the phase detector 110a generates the leading signal UP1 having a first logic value (such as logic value "1") and the lagging signal DN1 having a second logic value (such as logic value "0"). In contrast, when the phase detector 110a detects the phase of the input signal Din according to the clock signal φ1, and determines that the phase of the output clock signal CK need to be delayed, the phase detector 110a generates the leading signal UP1 having the second logic value (such as logic value "0") and the lagging signal DN1 having the first logic value (such as logic value "1"). The setting of the rest of phase detectors 110b-110d, the leading signals UP2-UP4, and the lagging signals DN2-DN4 can be operated in the similar way, therefore, the description will not repeat herein again.

In some embodiments, the signal controller 140a is configured to rearrange the received leading signals UP1-UP4 as the leading signal LEAD1, the leading signal LEAD2, the leading signal LEAD3, and the leading signal LEAD4 (i.e., a first part of the control signals LEAD1/LAG1-LEAD4/LAG4).

In some embodiments, the signal controller 140b is configured to rearrange the received lagging signals DN1-DN4 as the lagging signals LAG1, the lagging signals LAG2, the lagging signals LAG3, and the lagging signals LAG4 (i.e., a second part of the control signals LEAD1/LAG1-LEAD4/LAG4).

In some embodiments, the phase interpolator circuitry 120 is configured to forward the phase of the output clock signal CK according to the leading signal LEAD, and configured to delay the phase of the output clock signal CK according to the lagging signal LAG. In particularly, the phase interpolator 120a forwards the phase of the clock signal CKa according to the leading signal LEAD1, and delays the phase of the clock signal CKa according to the lagging signal LAG1. The operations of the phase interpolators 120b-120d are similar to the operation of the phase interpolator 120a, therefore, the description will not repeat herein again.

In some embodiments, the phase interpolator circuitry 120 adjusts the phase of the output clock signal CK according to the rearranged control signals LEAD/LAG.

Figure 4:
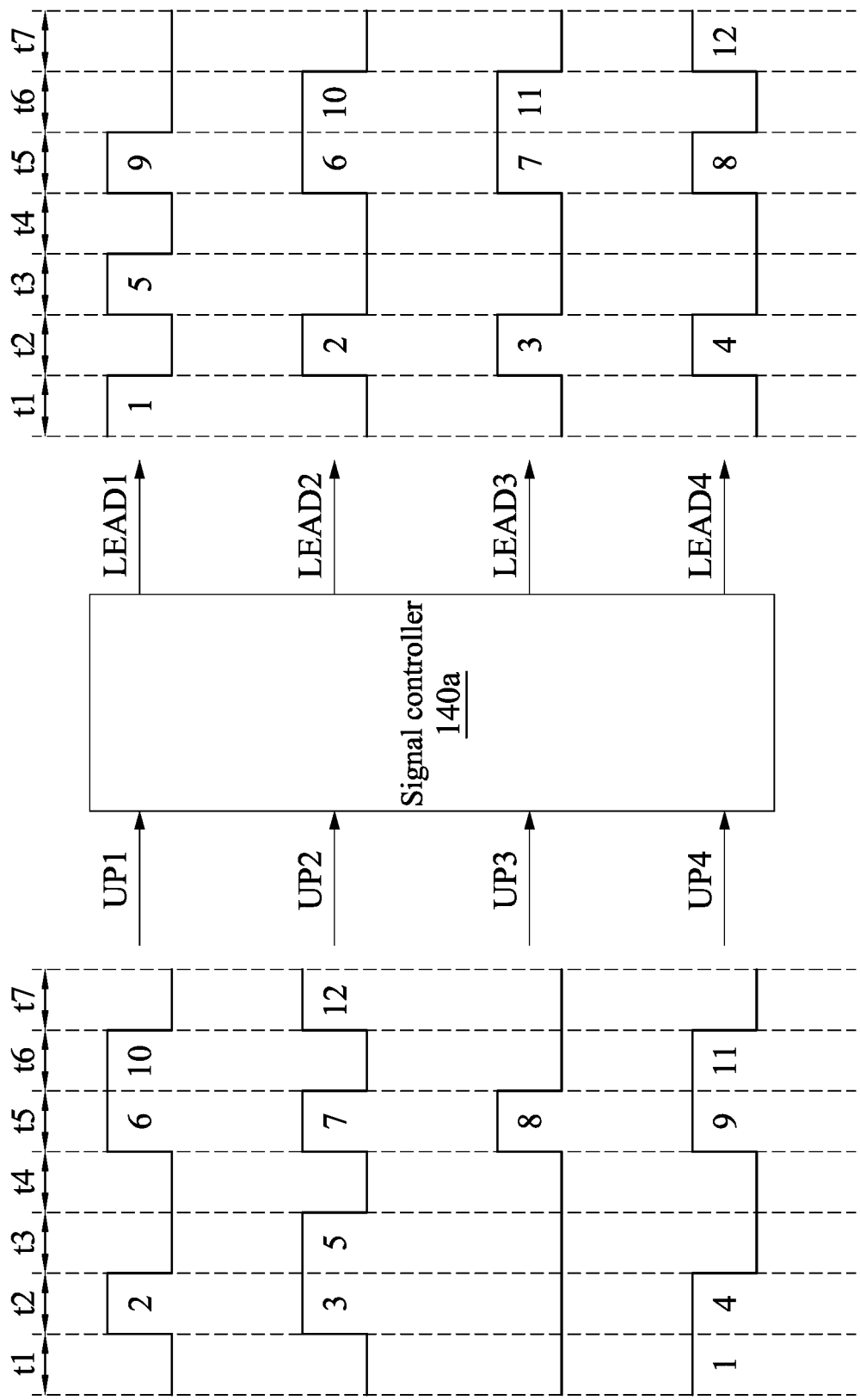
FIG. 4 is a schematic diagram of a signal controller shown in FIG. 3, in accordance with some embodiments.

Reference is made to FIG. 4. FIG. 4 is a schematic diagram of a signal controller 140a shown in FIG. 3 according to some embodiments of the present disclosure. For the better understanding, the similar elements in FIG. 4 are designated with the same reference numbers in FIG. 3. For illustration in FIG. 4, the left side of FIG. 4 illustrates a waveform of the leading signals UP1-UP4, and the right side of FIG. 4 illustrates a waveform of the leading signals LEAD1-LEAD4.

For illustration in FIG. 4, in a time period t1, the phase detector 110d outputs the leading signal UP4 (designated as signal 1 in FIG. 4) having the said first logic value (logic value "1"). In a time period t2, the phase detector 110a, the phase detector 110b, and the phase detector 110d output the leading signal UP1 (designated as signal 2 in FIG. 4), the leading signal UP2 (designated as signal 3 in FIG. 4), and the leading signal UP4 (designated as signal 4 in FIG. 4) having the first logic value. And so on, in time periods t1-t7, the phase detectors 110a-110d output the leading signals UP (designated as signal 1-12) having the first logic value.

In some embodiments, the signal controller 140a is configured to rearrange the leading signals UP1-UP4 as the leading signals LEAD1-LEAD4. Therefore, in the time periods t1-t7, the amount of the leading signals UP1-UP4 having the first logic value is equal to the amount of the leading signals LEAD1-LEAD4 having the first logic value.

In some embodiments, when the leading signal UP1-UP4 have a certain amount of the first logic value in a time period, the signal control 140a rearranges the leading signals UP1-UP4, in order to make the leading signals LEAD1-LEAD4 having same amount of the first logic value in the same time period. For example, for illustration in FIG. 4, the leading signals UP1-UP4 have one first logic value (which is signal 1) in time period t1, and have three first logic values (which are signals 2, 3, 4) in time period t2. Accordingly, the leading signals LEAD1-LEAD4 have one first logic value (which is signal 1) in time period t1, and have three first logic values (which is signal 2, 3, 4) in time period t2.

In some embodiments, the signal controller 140a rearranges the first logic values of the leading signals UP1-UP4 into the leading signals LEAD1-LEAD4 following a sequence of the control signals LEAD1-LEAD4. The operation herein will be discussed in detail with reference to FIG. 4 below.

In time period t1, the leading signal UP4 (i.e., signal 1) has the first logic value. The signal controller 140a rearranges the signal 1 into the leading signal LEAD1.

In time period t2, the leading signals UP1, UP2, UP4 (i.e., signal 2, 3, 4) have the first logic value. Before the time period t2, the leading signal LEAD1 is arranged the first logic value. Therefore, the signal controller 140a rearranges three signals 2, 3, 4 into the leading signals LEAD2, LEAD3, LEAD4.

In time period t3, the leading signal UP2 (i.e., signal 5) has the first logic value. Before the time period t3, the leading signal LEAD4 is the latest signal arranged with the first logic value. Therefore, following the sequence, the signal controller 140a rearranges the signal 5 into the leading signal LEAD1.

In time period t4, the leading signals UP1-UP4 do not have the first logic value. Therefore, the signal controller 140a does not generate leading signals LEAD1-LEAD4 having the first logic value.

In time period t5, the leading signals UP1-UP4 (i.e., signals 6, 7, 8, 9) have the first logic value. Before the time period t5, the leading signal LEAD1 is the latest signal arranged with the first logic value. Therefore, following the sequence, the signal controller 140a rearranges the signals 6, 7, 8, 9 into the leading signals LEAD2, LEAD3, LEAD4, LEAD1.

In time period t6, the leading signals UP1, UP4 (i.e., signals 10, 11) have the first logic value. Before the time period t6, the leading signal LEAD1 is the latest signal arranged with the first logic value. Therefore, following the sequence, the signal controller 140a rearranges the signals 10, 11 into the leading signals LEAD2, LEAD3.

In time period t7, the leading signals UP2 (i.e., signal 12) has the first logic value. Before the time period t7, the leading signal LEAD3 is the latest signal arranged with the first logic value. Therefore, following the sequence, the signal controller 140a rearranges the signal 12 into the leading signal LEAD4.

Alternatively stated, the signal controller 140a is configured to rearrange the first logic values in the leading signals UP1-UP4 into the leading signals LEAD1-LEAD4 following the sequence of the leading signals LEAD1, LEAD2, LEAD3, and LEAD4. In some embodiments, the signal controller 140a is configured to evenly distribute the first logic values in the leading signals UP1-UP4 to the leading signals LEAD1-LEAD4. Because the signal controller 140a sequentially distributes the first logic values to the leading signals LEAD1-LEAD4, the numbers of the first logic values in each of the leading signals LEAD1-LEAD4 are almost the same. For illustration in FIG. 4, after the operations are performed by the signal controller 140a, within the time periods t1-t7, each of the leading signals LEAD1-LEAD4 has three first logic values.

The leading signals LEAD1-LEAD4 mentioned above are provided for illustrative purposes. In the embodiments of the present disclosure, the leading signals LEAD and the lagging signals LAG can be operated at the same way, thus, the description will not repeat herein again.

In some embodiments, the signal controller 140a and the signal controller 140b have the same circuit structure. In some embodiments, any one of the signal controller 140a and the signal controller 140b can be implemented by the process circuit shown in FIG. 4 which performs the rearranging operation. In some embodiments, any one of the signal controller 140a and the signal controller 140b can be implemented by one or more logic gate (as shown in FIG. 5), however, the present disclosure is not limited thereto.

Figure 5:
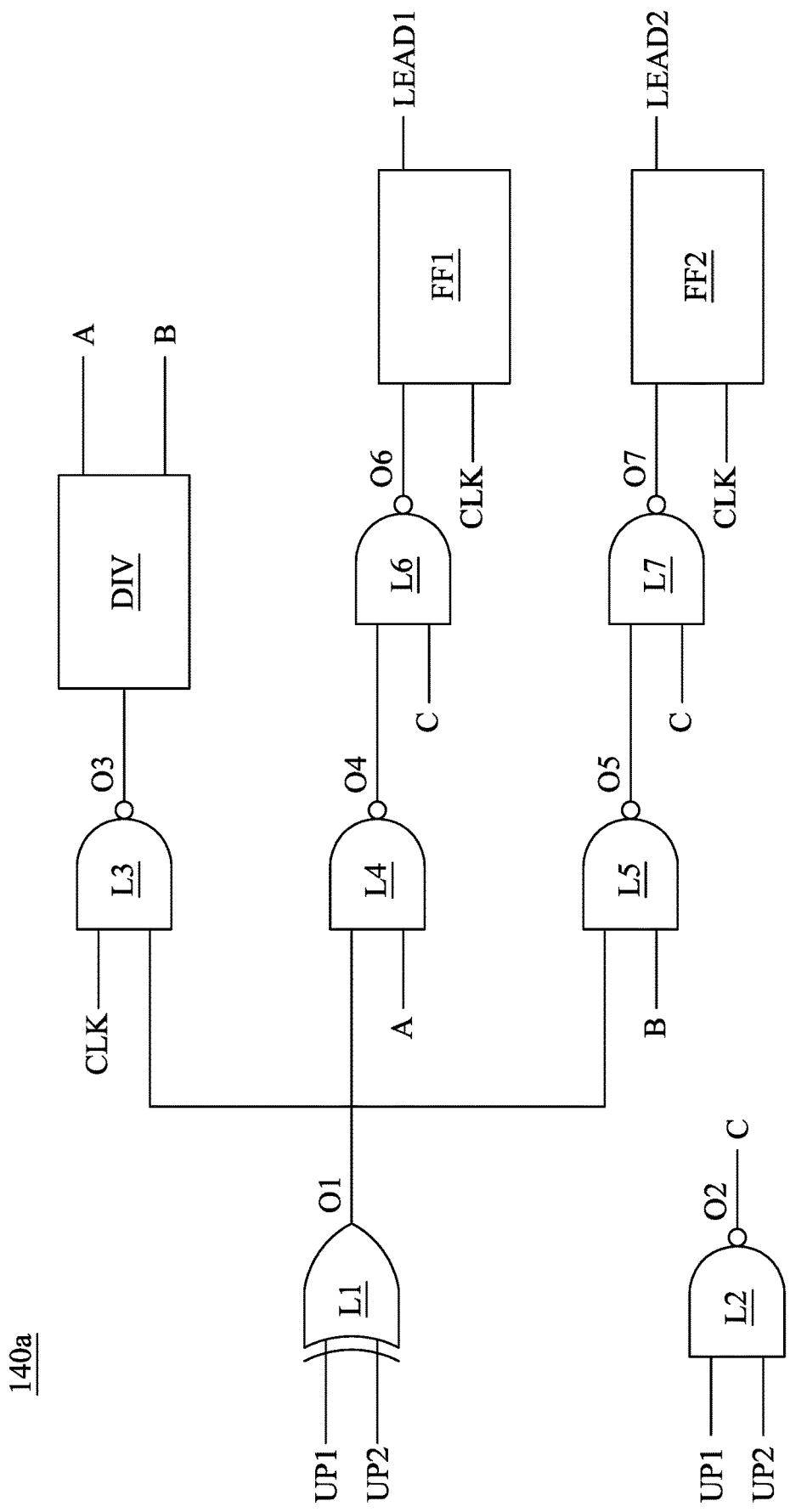
FIG. 5 is a schematic diagram of a signal controller shown in FIG. 4, in accordance with some other embodiments.

Reference is made to FIG. 5. FIG. 5 is a schematic diagram of a signal controller 140a shown in FIG. 4 according to some embodiments of the present disclosure. For the ease of understanding, the embodiment shown in FIG. 5 illustrates rearranging two leading signals UP1-UP2 as an example (i.e., the embodiment applied two phase detectors 110a, 110b and two phase interpolators 120a, 120b in FIGS. 1-3).

For illustration in FIG. 5, the signal controller 140a includes a logic gate L1, a logic gate L2, a logic gate L3, a logic gate L4, a logic gate L5, a logic gate L6, a logic gate L7, a divider DIV, a flip-flop FF1, and a flip-flop FF2.

For illustration in FIG. 5, a first input terminal and a second input terminal of the logic gate L1 are configured to receive the leading signal UP1 and the leading signal UP2, respectively, and to generate an output signal O1 to a first input terminal of the logic gates L3, L4, and L5. A second input terminal of the logic gate L3 is configured to receive an output clock signal CLK, and to generate an output signal O3 to the divider DIV. The divider DIV is configured to output a signal A and a signal B. In some embodiments, the divider DIV is configured to evenly divide the frequency of the received output signal O3. In this example, the divider DIV is configured to decrease the frequency of the output signal O3 to half (i.e., divide by 2), therefore, the frequency of the signal A and the signal B is half of the frequency of the output clock signal CLK. A second input terminal of the logic gate L4 is configured to receive the signal A, and to generate an output signal O4 to a first input terminal of the logic gate L6. A second input terminal of the logic gate L5 is configured to receive the signal B, and to generate an output signal O5 to a first input terminal of the logic gate L7. The first input terminal and the second input terminal of the logic gate L2 are configured to receive the leading signals UP1 and UP2, and to output the computed result to the second input terminal of the logic gates L6 and L7. The logic gate L6 is configured to transmit the output signal O6 to the flip-flop FF1. The logic gate L7 is configured to transmit the output signal O7 to the flip-flop FF2. The flip-flop FF1 is configured to generate the leading signal LEAD1 according to the output signal O6 and the output clock signal CLK. The flip-flop FF2 is configured to generate the leading signal LEAD2 according to the output signal O7 and the output clock signal CLK. In some embodiments, the output clock signal CLK can be output clock signal CK outputted by the phase interpolator circuitry 120.

In some embodiments, the logic gate L1 is an exclusive-OR (XOR) gate. Therefore, the output signal O1 can reflect that whether the leading signal UP1 or the leading signal UP2 has the first logic value (i.e., collecting the information of the leading signal UP1 and the leading signal UP2 having the first logic value). In some embodiments, the logic gates L2-L7 are NADN gates. In some embodiments, the flip-flops FF1-FF2 are D flip-flops. The output signal O2 can reflect that whether the leading signal UP1 and the leading signal UP2 have the first logic value at the same time period. When the leading signal UP1 and the leading signal UP2 have the first logic value at the same time period, the output signal O2 has a logic value "0". In response to the output signal O2 having the logic value "0", the logic gate L6 and the logic gate L7 output the output signals O6-O7 having the logic value "1". Accordingly, both of the flip-flops FF1-FF2 are updated to output the leading signals LEAD1-LEAD2 having the first logic value.

In some embodiments, the logic gate L4 can compare the signal A with the output signal O1, and output the output signal O4 having the logic value "0" to update the leading signal LEAD1 when the signal A and the output signal O1 having logic value "1". Similarly, the logic gate L5 can compare the signal B with the output signal O1, and output the output signal O5 having the logic value "0" to update the leading signal LEAD2 when the signal B and the output signal O1 having logic value "1". The frequency of the signal A and the signal B are half of the frequency of the output signal O3, in which the output signal O3 is generated according to the clock signal CLK and the output signal O1. In general condition, the logic gate L4 and the logic gate L5 alternatively generate the output signal O4 having the logic value "0" and the output signal O5 having the logic value "0". Therefore, the leading LEAD1 and the leading signal LEAD2 alternatively have the logic value "1", to effectively implement the rearranging operation shown in FIG. 4.

The configuration of the signal controller 140a shown in FIG. 5 is provided for illustrative purposes. Various configurations of the signal controller 140a are within the contemplated scope of the present disclosure.

Figure 6:
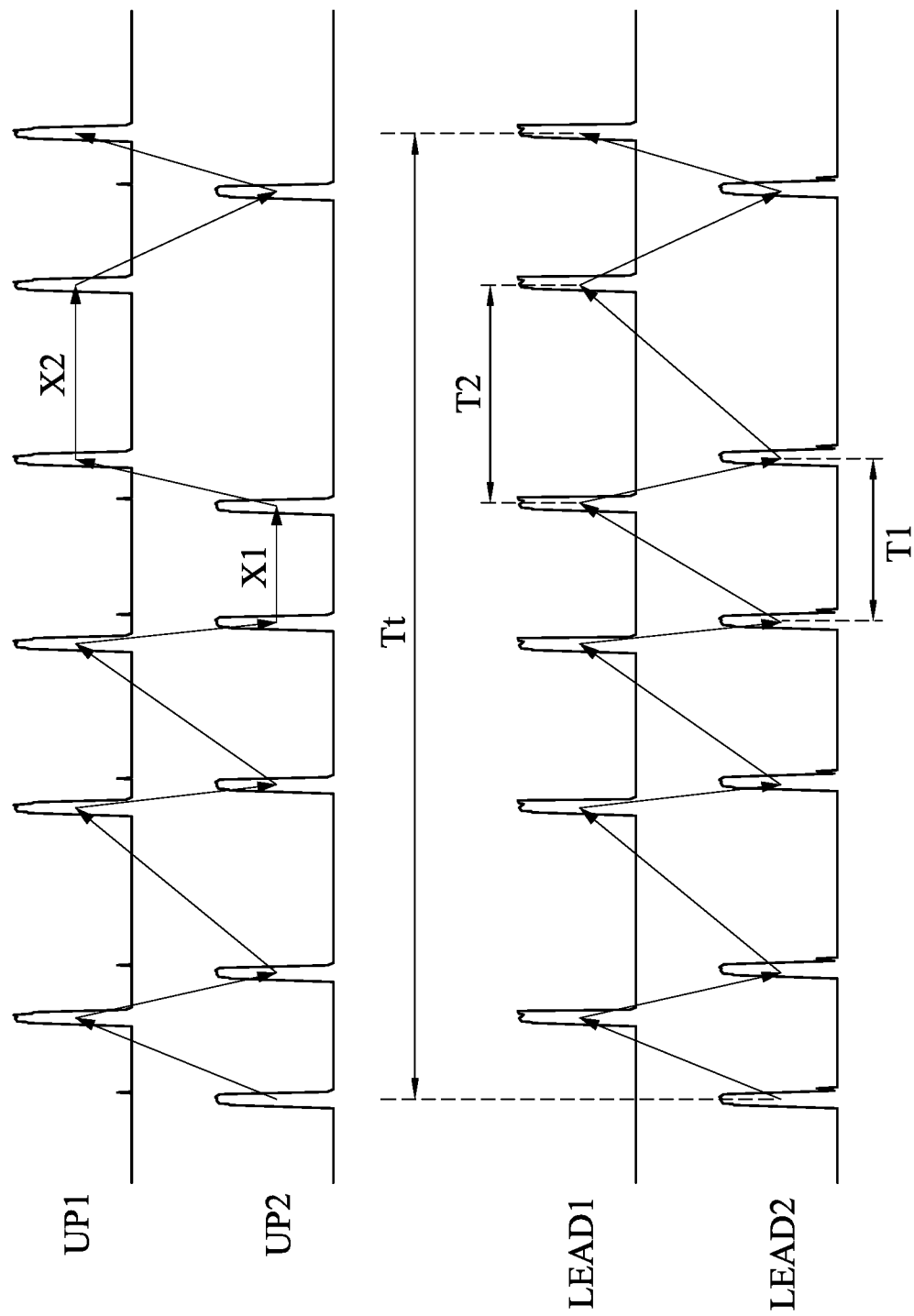
FIG. 6 is a schematic diagram of a waveform operated in the signal controller, in accordance with some embodiments.

Reference is made to FIG. 6. FIG. 6 is a schematic diagram of a waveform operated in the signal controller 140a according to some embodiments of the present disclosure. For illustration in FIG. 6, the waveform diagram includes the relationship between time and the waveforms of the leading signal UP1, the leading signal UP2, the leading signal LEAD1, and the leading signal LEAD2. In FIG. 6, when the waveform of signal is a pulse, it is represented that the signal has the said first logic value.

For illustration in FIG. 6, the leading signal UP1 has two first logic values in time period X2. In the meanwhile, in the time period X2, the leading signal UP2 does not have the first logic value. In addition, the leading signal UP2 has two first logic values in the time period X1. In the meanwhile, in the time period X1, the leading signal UP1 does not have the first logic value.

The signal controller 140a rearranges the leading signal UP1 and the leading signal UP2, and to output as the leading signal LEAD1 and the leading signal LEAD2. For illustration in FIG. 6, the leading signal LEAD1 and the leading signal LEAD2 alternatively have the first logic value. For example, in the time periods T1, T2 which corresponding to the time period X1, X2, the leading signal LEAD1 and the leading signal LEAD2 alternatively have the first logic value. Therefore, after the phase interpolator circuitry 120 receives the abovementioned leading signal LEAD1 and leading signal LEAD2, the phase interpolator circuitry 120 can sequentially adjust the phase of the clock signal CKa and the clock signal CKb.

By rearranging the leading signal UP1 and the leading signal UP2, during a period of the phase of the clock signal CKa being adjusted twice by the phase interpolator circuitry 120 (for example, in the time period T2), the phase interpolator circuitry 120 adjusts the phase of the clock signal CKb once. Alternatively stated, during the phase updating period Tt (such as the time periods t1-t7 shown in FIG. 4), the phase interpolator circuitry 120 un-continuously adjusts the phase of one of the corresponding clock signals CKa, CKb.

In some approaches, the phase interpolator does not adjust the corresponding phase in sequence. For example, the phase interpolator performs the adjustment operation according to the leading signals UP1-UP2 directly. The phase interpolator continuously adjust the phase of the corresponding clock according to the two first logic value of the leading signal UP2 in the time period X1, and further adjust the phase of the corresponding clock according to the two first logic value of the leading signal UP1 in the time period X2. As a result, the phases of those clocks are over adjusted to become out of phase. In this situation, the two clocks are canceled to each other, and the phase interpolator outputs zero clock (i.e., no clock outputted). Therefore, the clock data recovery is out of function, and the system cannot work properly. In some applications, the abovementioned phenomenon is referred to as destructive interference.

Compared to the above approaches, in the embodiments of the present disclosure, the control signals UP/DOWN are rearranged as the control signals LEAD/LAG. Thus, the phase interpolator circuitry 120 adjusts the phases of the clock signals CKa, CKb, CKc, and CKd in sequence, and the phases of the clock signals CKa, CKb, CKc, and CKd will not be over adjusted to avoid the output clock signal CK disappearing.

It is noticed that, for ease of understanding, the first logic value in the above embodiments can be set as logic value "1", and the second logic value in the above embodiments can be set as logic value "0". However, the setting operations above are provided for illustrative purposes. According to various circuit implementations or applications, the first logic value can be set as logic value "0", and the second logic value cane be set as logic value "1". Therefore, the present disclosure is not limited thereto.

Figure 7:
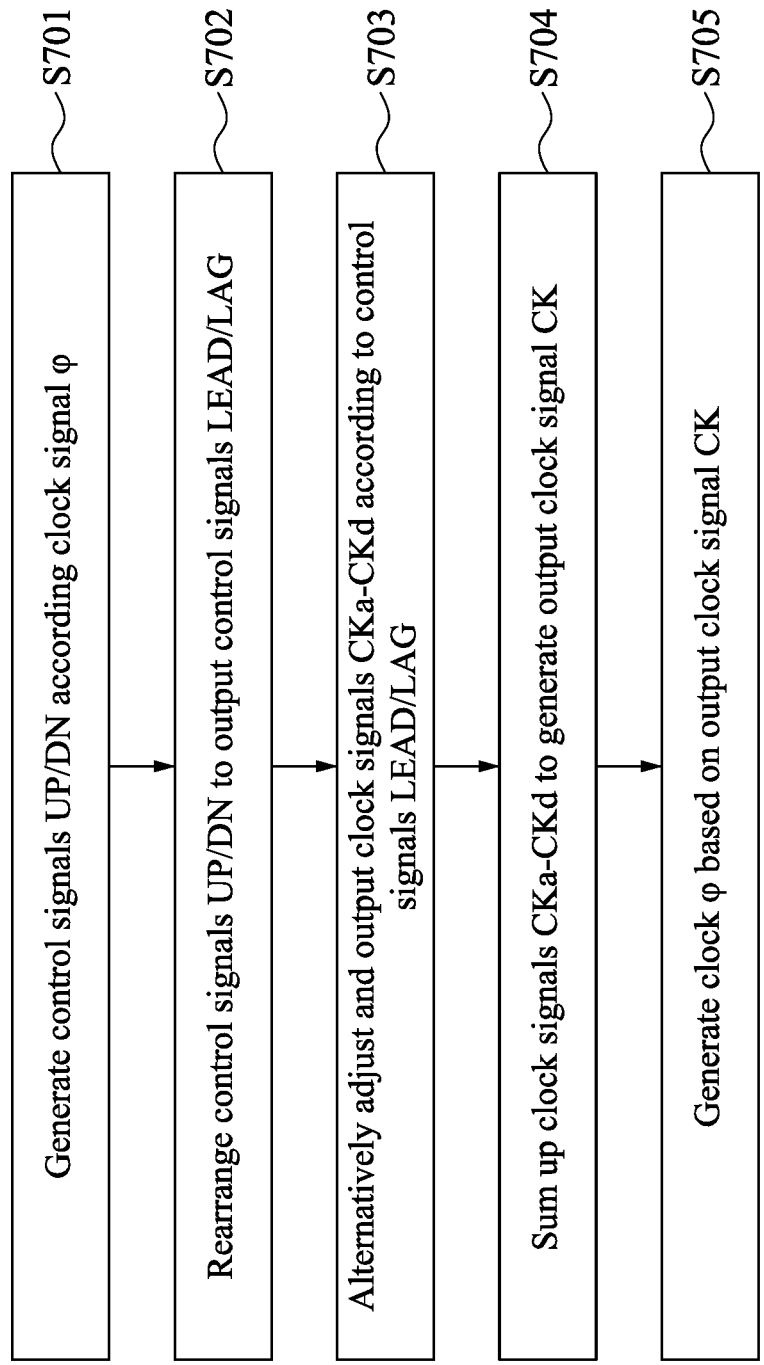
FIG. 7 is a flowchart of a clock data recovery method, in accordance with some embodiments.

Reference is made to FIG. 7. FIG. 7 is a flowchart of a clock data recovery method 700 according to some embodiments of the present disclosure. For the better understanding, FIG. 7 is described with reference to FIGS. 1-6, and similar elements described in FIG. 7 are designated with the same reference numbers shown in FIGS. 1-6. For illustration in FIG. 7, the clock data recovery method 700 includes operations S701, S702, S703, S704, and S705.

In operation S701, the phase detector circuitry 110 detects the phase of the input signal Din according to the clock signals φ1~φ4, to generate the control signals UP/DN. In some embodiments, the control signals UP/DN includes control signals UP1/DN1-UP4/DN4 which have phases different to each other.

In operation S702, the signal control circuitry 140 rearranges the control signals UP/DN to output as control signals LEAD/LAG, and transmits the control signals LEAD/LAG to the phase interpolator circuitry 120. In some embodiments, the amount of the control signals UP/DN is the same as the amount of the control signals LEAD/LAG.

In some embodiments, the control signals UP/DN includes leading signals UP and lagging signals DN. The signal control circuitry 140 rearranges the leading signals UP as the leading signals LEAD in the control signals LEAD/LAG, and rearranges the lagging signals DN as the lagging signals LAG in the control signals LEAD/LAG. In some embodiments, during a phase updating period, the signal control circuitry 140 evenly transmits the leading signals LEAD and the lagging signals LAG to the phase interpolators 120a-120d of the phase interpolator circuitry 120.

In operation S703, the phase interpolators 120a-120d of the phase interpolator circuitry 120 output the clock signals CKa-CKd, and alternatively adjust the phases of the clock signals CKa-CKd according to the control signals LEAD/LAG. For example, the phase interpolator 120a adjusts the clock signal CKa, and the phase interpolator 120b adjusts the clock signal CKb. During a time period that the clock signal CKa being adjusted twice by the phase interpolator 120a, the phase interpolator 120b adjusts the clock signal CKb once. In some embodiments, the phase interpolator circuitry 120 outputs the clock signals CKa-Ckd further according to the reference clock signal CKI generated by the phase-locked loop.

In operation S704, the phase interpolator circuitry 120 sums up the clock signals CKa-CKd to generate the output clock signal CK.

In operation S705, the divider circuit 150 generates the clock signals φ1~φ4 based on the output clock signal CK, and transmits the clock signals φ1~φ4 to the phase detector circuitry 110.

The above clock data recovery method 700 includes exemplary operations, but the operations are not necessarily performed in the order shown. Operations of the clock data recovery method 700 may be added, replaced, changed order, and/or eliminated as appropriate, in accordance with the spirit and scope of various embodiments of the present disclosure.

Based on the above, the clock data recovery device and method provided by the embodiments of the present disclosure can rearrange the phase control signals to make the phase interpolators alternatively adjust the phases of the outputted clock signals. Hence, the issue of destructive interference can be avoided, and the stability of the system is enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock data recovery device, comprising:
   a phase detector circuitry configured to detect a phase of an input signal according to a plurality of first clock signals, to generate a plurality of first control signals, wherein phases of the first clock signals are different to each other;
   a signal control circuitry configured to rearrange the plurality of first control signals to output as a plurality of second control signals, wherein a plurality of first logic values of the first control signals are rearranged into the second control signals following a sequence of the second control signals; and
   a plurality of phase interpolators configured to output a plurality of second clock signals, respectively, and to alternatively adjust phases of the plurality of second clock signals to generate an output clock signal, according to the plurality of second control signals.

2. The clock data recovery device of claim 1, wherein the plurality of first clock signals are generated based on the output clock signal.

3. The clock data recovery device of claim 1, wherein the plurality of phase interpolators are further configured to sum up the plurality of second clock signals as the output clock signal.

4. The clock data recovery device of claim 1, wherein the plurality of phase interpolators comprise:
   a first interpolator configured to adjust a phase of a first signal of the plurality of second clock signals; and
   a second interpolator configured to adjust a phase of a second signal of the plurality of second clock signals,
   wherein during a period between the phase of the first signal being adjusted twice, the phase of the second signal is adjusted once.

5. The clock data recovery device of claim 1, wherein the phase detector circuitry comprises:
   a plurality of phase detectors configured to detect the phase of the input signal according to the plurality of first clock signals, to output the plurality of first control signals, respectively, wherein an amount of the plurality of phase detectors is equal to an amount of the plurality of phase interpolators.

6. The clock data recovery device of claim 1, wherein the signal control circuitry comprises:
   a first signal controller configured to receive a plurality of leading signals of the plurality of first control signals, and to rearrange the plurality of leading signals as a first part of the plurality of second control signals; and
   a second signal controller configured to receive a plurality of lagging signals of the plurality of first control signals, and to rearrange to plurality of lagging signals as a second part of the plurality of second control signals.

7. The clock data recovery device of claim 1, wherein during a phase updating period, the plurality of phase interpolators un-continuously adjust a phase of a corresponding second clock signal in the plurality of second clock signals.

8. The clock data recovery device of claim 1, further comprising:
   a phase-locked loop coupled to the plurality of phase interpolators, configured to generate a reference clock signal to the plurality of phase interpolators,
   wherein the plurality of phase interpolators output the plurality of second clock signals according to the reference clock signal and the plurality of second control signals.

9. The clock data recovery device of claim 6, wherein during a phase updating period, the first part of the plurality of second control signals and the second part of the plurality of second control signals are evenly transmitted to the plurality of phase interpolators.

10. A clock data recovery method, comprising:
    according to a plurality of first clock signals, detecting a phase of an input signal to generate a plurality of first control signals, wherein phases of the plurality of first control signals are different to each other;
    rearranging the plurality of first control signals to output as a plurality of second control signals, wherein a plurality of first logic values of the first control signals are rearranged into the second control signals following a sequence of the second control signals; and
    outputting, by a plurality of phase interpolators, a plurality of second clock signals, and alternatively adjusting phases of the plurality of second clock signals to generate an output clock signal, according to the plurality of second control signals.

11. The clock data recovery method of claim 10, wherein generating the output clock signal comprises:
    summing up the plurality of second clock signals as the output clock signal.

12. The clock data recovery method of claim 10, wherein alternatively adjusting the phases of the plurality of second clock signals comprises:
   adjusting a phase of a first signal of the plurality of second clock signals; and
   adjusting a phase of a second signal of the plurality of second clock signals,
   wherein during a period between the phase of the first signal being adjusted twice, the phase of the second signal is adjusted once.

13. The clock data recovery method of claim 10, wherein an amount of the plurality of first control signals is equal to an amount of the plurality of second control signals.

14. The clock data recovery method of claim 10, wherein rearranging the plurality of first control signals to output as the plurality of second control signals comprises:
   rearranging a plurality of leading signals of the plurality of first control signals to output as a first part of the plurality of second control signals; and
   rearranging a plurality of lagging signals of the plurality of first control signals to output as a second part of the plurality of second control signals.

15. The clock data recovery method of claim 10, wherein during a phase updating period, un-continuously adjusting, by the plurality of phase interpolators, a phase of a corresponding second clock signal in the plurality of second clock signals.

16. The clock data recovery method of claim 10, further comprising:
   generating, by a phase-locked loop, a reference clock signal to the plurality of phase interpolators,
   wherein the plurality of phase interpolators generate the plurality of second clock signals according to the reference clock signal and the plurality of second control signals.

17. The clock data recovery method of claim 10, further comprising:
   based on the output clock signal, generating, by a divider circuit, the plurality of first clock signals.

18. The clock data recovery method of claim 14, further comprising:
   during a phase updating period, evenly transmitting the first part of the plurality of second control signals and the second part of the plurality of second control signals to the plurality of phase interpolators.

* * * * *